United States Patent
Patankar et al.

(10) Patent No.: US 8,688,748 B2
(45) Date of Patent: Apr. 1, 2014

(54) ADAPTIVE TABLE SIZING FOR MULTIPLE-ATTRIBUTE PARAMETERS

(75) Inventors: Kaushal Patankar, Maharashtra (IN); Sanjay Maneklal Patel, Canton, MI (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 253 days.

(21) Appl. No.: 13/009,929

(22) Filed: Jan. 20, 2011

(65) Prior Publication Data
US 2011/0178787 A1 Jul. 21, 2011

Related U.S. Application Data

(60) Provisional application No. 61/297,165, filed on Jan. 21, 2010, provisional application No. 61/297,158, filed on Jan. 21, 2010.

(51) Int. Cl.
*G06F 17/30* (2006.01)
(52) U.S. Cl.
CPC ..................... *G06F 17/30* (2013.01)
USPC ........................ 707/803; 707/796; 707/802
(58) Field of Classification Search
CPC ....................................................... G06F 17/30
USPC ......... 707/601–602, 649, 694, 790–793, 796, 707/802–810, 812; 717/120, 170, 175, 169
See application file for complete search history.

(56) References Cited

U.S. PATENT DOCUMENTS

| | | | |
|---|---|---|---|
| 6,587,856 B1 * | 7/2003 | Srinivasan et al. | 707/802 |
| 2002/0184111 A1 * | 12/2002 | Swanson | 705/26 |
| 2003/0033191 A1 * | 2/2003 | Davies et al. | 705/10 |
| 2004/0002944 A1 * | 1/2004 | Hauser et al. | 707/1 |
| 2004/0034850 A1 * | 2/2004 | Burkhardt et al. | 717/120 |
| 2004/0181417 A1 * | 9/2004 | Piller et al. | 705/1 |
| 2004/0193633 A1 * | 9/2004 | Petculescu et al. | 707/101 |
| 2005/0055626 A1 | 3/2005 | Kotler et al. | |
| 2005/0065971 A1 * | 3/2005 | Honda | 707/102 |
| 2005/0278232 A1 * | 12/2005 | Bruffey et al. | 705/30 |
| 2006/0129980 A1 * | 6/2006 | Schmidt et al. | 717/114 |
| 2006/0212821 A1 * | 9/2006 | Charles et al. | 715/764 |
| 2006/0218478 A1 * | 9/2006 | Nonclercq et al. | 715/500 |
| 2008/0021908 A1 | 1/2008 | Trask et al. | |
| 2009/0276270 A1 * | 11/2009 | Karnataka | 705/8 |

FOREIGN PATENT DOCUMENTS

| | | | |
|---|---|---|---|
| EP | 0977137 | * | 2/2000 |
| EP | 1544764 | * | 6/2005 |
| WO | WO 2006/055064 | * | 5/2006 |

* cited by examiner

*Primary Examiner* — Srirama Channavajjala

(57) ABSTRACT

A product lifecycle management (PLM) system, method, and machine-readable medium. A method includes receiving dimension information for a table structure for a plurality of related attributes of a PLM object. The method includes creating a common table definition corresponding to the plurality of related attributes. The method includes creating a plurality of table structures according to the common table definition, each of the plurality of table structures corresponding to a respective one of the plurality of related attributes.

24 Claims, 3 Drawing Sheets

ADAPTIVE TABLE SIZING FOR MULTIPLE-ATTRIBUTE PARAMETERS

CROSS-REFERENCE TO RELATED APPLICATION

This application claims the benefit of the filing date of U.S. Provisional Patent Applications 61/297,165 and 61/297,158, both filed Jan. 21, 2010, which are hereby incorporated by reference. This application also includes some subject matter in common with U.S. patent application Ser. No. 13/009,944, filed Jan. 20, 2011, for "Product Lifecycle Management Using a Sparsely Populated Table", which is hereby incorporated by reference.

TECHNICAL FIELD

The present disclosure is directed, in general, to systems and methods for computer-aided design, manufacturing, engineering, modeling, and visualization (individually and collectively, "CAD" and "CAD systems"), and to systems that manage product lifecycle data for manufacturers, companies, suppliers, and customers ("PLM systems").

BACKGROUND OF THE DISCLOSURE

Many manufactured products are first designed and modeled in CAD systems, and complex data is often managed in PLM systems. Improved systems are desirable.

SUMMARY OF THE DISCLOSURE

Various embodiments include systems, methods, and computer program products for adaptive creation, display, and storage of parameter tables in PLM systems. A method includes receiving dimension information for a table structure for a plurality of related attributes of a PLM object. The method includes creating a common table definition corresponding to the plurality of related attributes. The method includes creating a plurality of table structures according to the common table definition, each of the plurality of table structures corresponding to a respective one of the plurality of related attributes.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
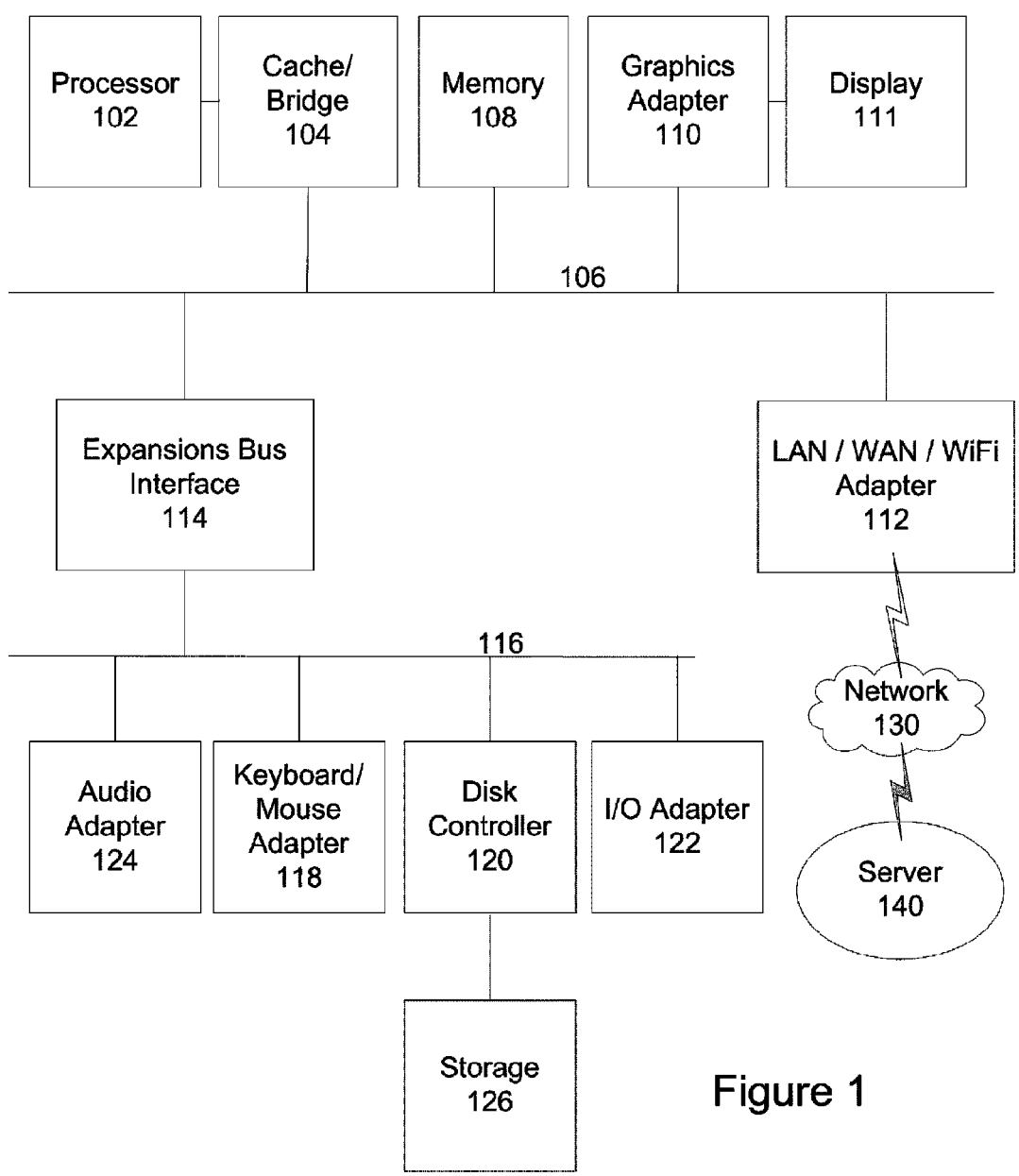
FIG. 1 depicts a block diagram of a data processing system in which an embodiment can be implemented.
Figure 2:
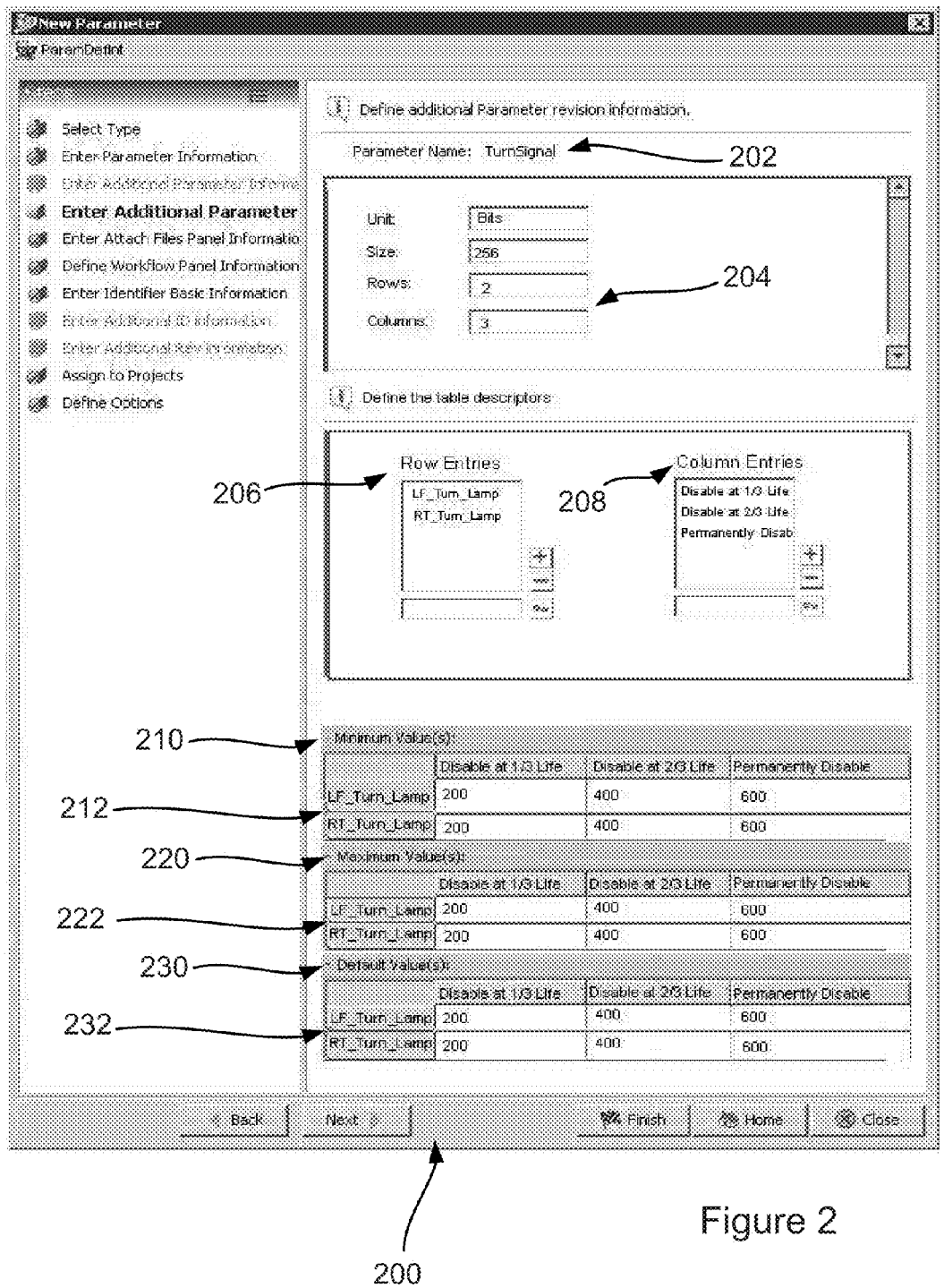
FIG. 2 illustrates an example of a disclosed embodiment UI.
Figure 3:
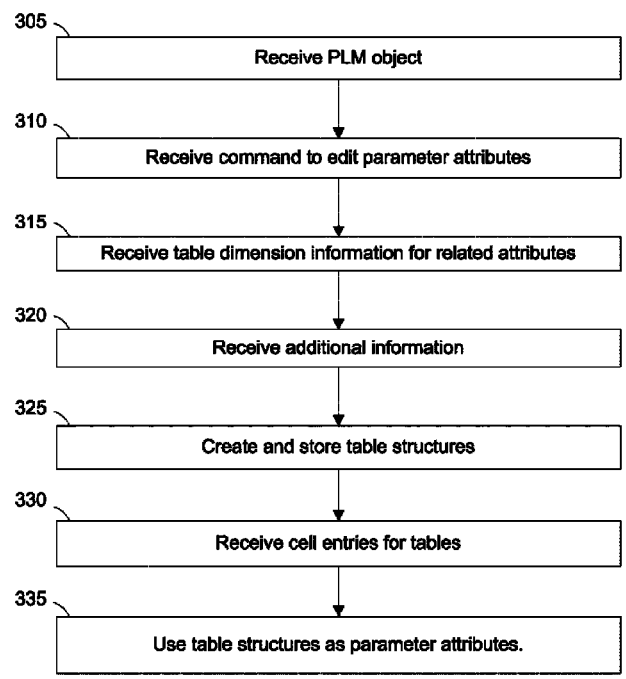
FIG. 3 depicts a process in accordance with disclosed embodiments.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Various embodiments include systems and methods for calibration and configuration parameter sizes to be captured through an adaptive user interface (UI). The system receives these inputs and updates one or more tables displayed in the UI when users change the size of the parameters. The tables displayed in the UI can be used for capturing the parameter information. These tables are automatically resized and the corresponding table attributes are displayed, thereby ensuring that all the parameters attributes are in sync with the parameters specification.

Currently, there is no process for managing a UI to capture Table attributes of calibration and configuration data that adaptively render the Tables in the UI based on changes in the size of these parameters. Users currently use error prone mechanisms such as spreadsheets to capture tabular data, and a change in size of the parameter requires manual rework to enter the tabular data back in. There is no way to ensure that the parameter specifications set through these tables are all in sync and of same size using current techniques. Similarly, when values for these configuration and calibration parameters are specified, the current spreadsheet process is error prone as parameter values can be out of sync with the parameter specification. By applying a consistent table definition to all related attributes of the parameter specification, the various attributes are all kept in a synchronized, common format. Further, in various embodiments, the common table definitions ensure that each user works with a similar user interface, ensuring that the values or other data entered for the parameters or attributes is consistent and corresponds to the table definition.

FIG. 1 depicts a block diagram of a data processing system in which an embodiment can be implemented. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EE-PROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Several industries, including automotive, aircraft, satellite, trains, ATM stations, Park Meters, and others, employ software-based calibration and configuration and on a regular basis and deal with Table attributes for their parameters. These users currently have to rely on inputting data in spreadsheets and do not have an adaptive mechanism to account for size changes in parameters. By entering and capturing the parameter information through an adaptive UI that changes based on changes made to the parameter size, users are provided a non-error prone approach and can quickly modify the size of the parameter and visually modify the pertinent tabular attribute information. This also enables having all the required data in sync with the specification of the parameter Various disclosed embodiments provide calibration and configuration parameter sizes that are captured through an adaptive UI which updates when users change the size of the parameters. In this way, the system updates the UI for capturing the parameter attribute information, including automatically resizing and rendering the corresponding table attributes, ensuring that all the parameters attributes are in sync with the parameters specification.

FIG. 2 illustrates an example of a disclosed embodiment UI. Various embodiments first capture size-related information of the parameter through the UI or by examination of stored data structures. The system can employ listener modules to automatically render the tabular attribute data based on size entered. The system can also prompt for and receive such information as row and column descriptors, maximum and minimum boundaries for the table entries (or other restrictions on table entries), table descriptors, initial or default values, table value units and resolutions, and other data has described and illustrated herein. Using these values, the system can display an appropriate UI for interaction with a user, receive parameter values through the UI, and store these values in the PLM system. Where there are multiple related attributes for a parameter, various embodiments ensure that a common stable structure is created for each of the related attributes, so that the structures for the related attributes remain synchronized.

In various embodiments, for example, when the system receives changes to the Rows and Columns fields for a parameter, the system automatically resizes and adapts the related Minimum Values, Maximum Values and Default Values tables according to the changes.

in various embodiments, for example, when the system receives changes to Row Entries and Column Entries, the system automatically adapts and updates the Minimum Values, Maximum Values and Default Values table to show the Table's row and column headers. The system can receive such information as row and column descriptors, which are stored in a table structure or corresponding table definition. The table structure can be a sparsely-populated table structure. The table structure can be maintained as a set of variable-length arrays, and can represent data in an N×M structure, including a 1 dimensional array.

For example, FIG. 2 shows a user interface 200. This UI is for a plurality of related attributes of a parameter 202 for a PLM object, and depicts attributes of a TurnSignal parameter 202. In this case, there are three related attributes for the TurnSignal parameter—Minimum Values 210, Maximum Values 220, and Default values 230.

Through one or more interactions with a user, a PLM system receives various information related to the attributes, as described herein. In this case, the PLM system receives table dimensions 204. The system can also receive other information such as the row entries 206 and column entries 208; the number of entries corresponds to the table dimensions 204.

The system then builds a common table definition (not shown in the UI) corresponding to the information received. Based on the common table definition, the system builds a table corresponding to each of the three related attributes. In this case, table 212 corresponds to Minimum Value 210, table 222 corresponds to Maximum Value 220, and table 232 corresponds to Default Value 230. Note that each of the tables 212, 277, and 232 are structured in common, since the related attributes each use a common table definition.

In various embodiments, a common table definition is used to change the display and storage of Minimum, Maximum and Initial values tables, to ensure that these related table attributes remain structurally synchronized.

The disclosed embodiments are the first approach to dynamic parameter table sizing in a PLM system for related attributes. Disclosed embodiments manage table attributes of calibration and configuration parameters through an adaptive UI in a PLM system which puts the attributes in sync with parameter specifications and can ensure that the values defined for the parameters are consistent with the parameter specifications and any information in the common table definition.

FIG. 3 depicts a process in accordance with disclosed embodiment, as can be performed by a configured product lifecycle management (PLM) system.

A PLM system receives a PLM object (step 305). This can be, for example, a part or component for an assembly, or otherwise. The PLM system can be implemented, for example, as a data processing system 100, or as multiple data processing systems 100 acting together to perform the processes described herein. "Receiving", as used herein, can include loading from storage, receiving from another process or data processing system, receiving through an interaction with a user, or otherwise.

in various embodiments, the PLM object has as least one parameter that is represented by a plurality of related attributes. For example, related attributes could be maximum, minimum, and initial values for the parameter, minimum and maximum sizes, weights, or other physical or dimensional constraints, or otherwise. The related attributes can have multiple aspects; that is, using the example of FIG. 2, there may be multiple attribute values under a number of conditions, such as various RPM settings or engine temperatures, that indicate that each of the attributes should be represented in a table structure (including a one-dimensional array in some cases).

The PLM system receives a command to edit the parameter attributes for the PLM object (step 310). This command can include creating or adding new parameter attributes, or can include editing existing parameter attributes.

The PLM system receives dimension information for a table structure for the related attributes (step 315). For example, this step can include receiving a number of rows and columns for the table structure. The dimension information can be stored in a table definition that is associated with and common to the plurality of attributes.

The PLM system can receive additional table information for the table attributes (step 320). This additional table information can describe the table or the attributes, and can include, for example, a name, description, unique identifier corresponding to the PLM object, Size Units, Size, Resolution, Rows, Columns, row descriptors, column descriptors, data types for the cells of the table, or other information. This additional table information can also be stored, for example, in the table definition.

The PLM system creates and stores a plurality of table structures according to the common table definition, each one corresponding to a respective one of the plurality of related attributes (step 325). This step can include creating new table structures, if there were no pre-existing table structures for the related attributes, or changing or replacing existing table structures for the related attributes. By creating the plurality of table structures from a common table definition, the PLM system ensures that the table structures for the related attributes are created and maintained in a common structure, to eliminate later conflict. The table structures have multiple cells.

The PLM system can also receive entries for one or more of the cells in the table structures (step 330). The PLM system can maintain the table structures as sparsely-populated table structures. This step can be performed at any time when a user enters entries for the cells in the table structures, and can include displaying a user interface that includes tables for the related attributes that are consistent with the common table definition, such as displaying the proper size for the tables and proper row and column descriptors. In various embodiments, the PLM system verifies that the tables in the user interface are in sync for each of the related attributes and that the entries received through the user interface for entry in the cells of the table correspond to and are consistent with the common table definition, for example in terms of any of the additional table information described above.

The PLM system uses the plurality of table structures as parameter attributes for the PLM object (step 335).

In various embodiments, various steps described herein can be omitted, repeated, performed sequentially or concurrently, performed in a different order, or otherwise, as described by the claims below. For example, in many cases, multiple cells will be created for the table object, and the system will receive and store information in each of the created cells. The results of various steps can also optionally be displayed to a user, stored, and/or transmitted to another system.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually early out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method, performed by a hardware product lifecycle management (PLM) system, comprising:
   receiving dimension information for a table structure for a plurality of related attributes of a PLM object by the PLM system;
   creating a common table definition corresponding to the plurality of related attributes by the PLM system; and
   creating a plurality of table structures according to the common table definition by the PLM system, each of the plurality of table structures corresponding to a respective one of the plurality of related attributes.

2. The method of claim 1, wherein the PLM system receives a command to edit the related attributes.

3. The method of claim 1, wherein the related attributes are associated with a parameter of the PLM object.

4. The method of claim 1, wherein creating a plurality of table structures includes creating new table structures.

5. The method of claim 1, wherein creating a plurality of table structures includes replacing existing table structures.

6. The method of claim 1, wherein the PLM system receives additional table information for the table attributes that includes at least one of a name, a description, a unique identifier corresponding to the PLM object, size units, a size, a resolution, row descriptors, data type, and column descriptors.

7. The method of claim 1, wherein the PLM system receives entries for one or more cells of the tables structures.

8. The method of claim 1, wherein the PLM system receives entries for one or more cells of the tables structures and verifies that the entries are consistent with the common table definition.

9. A product lifecycle management (PLM) system, comprising:
   a processor; and
   a storage connected to be accessed by the processor, wherein the PLM system is configured to perform the steps of
   receiving dimension information for a table structure for a plurality of related attributes of a PLM object;
   creating a common table definition corresponding to the plurality of related attributes; and
   creating a plurality of table structures according to the common table definition, each of the plurality of table structures corresponding to a respective one of the plurality of related attributes.

10. The PLM system of claim 9, wherein the PLM system receives a command to edit the related attributes.

11. The PLM system of claim 9, wherein the related attributes are associated with a parameter of the PLM object.

12. The PLM system of claim 9, wherein creating a plurality of table structures includes creating new table structures.

13. The PLM system of claim 9, wherein creating a plurality of table structures includes replacing existing table structures.

14. The PLM system of claim 9, wherein the PLM system receives additional table information for the table that includes at least one of a name, a description, a unique identifier corresponding to the PLM object, size units, a size, a resolution, row descriptors, data type, and column descriptors.

15. The PLM system of claim 9, wherein the PLM system receives entries for one or more cells of the tables structures.

16. The PLM system of claim 9, wherein the PLM system receives entries for one or more cells of the tables structures and verifies that the entries are consistent with the common table definition.

17. A non-transitory machine-readable medium encoded with executable instructions, that, when executed, cause a product lifecycle management (PLM) system to perform the steps of:
   receiving dimension information for a table structure for a plurality of related attributes of a PLM object;
   creating a common table definition corresponding to the plurality of related attributes; and
   creating a plurality of table structures according to the common table definition, each of the plurality of table structures corresponding to a respective one of the plurality of related attributes.

18. The machine-readable medium of claim 17, wherein the instructions further cause the PLM system to receive a command to edit the related attributes.

19. The machine-readable medium of claim 17, wherein the related attributes are associated with a parameter of the PLM object.

20. The machine-readable medium of claim 17, wherein creating a plurality of table structures includes creating new table structures.

21. The machine-readable medium of claim 17, wherein creating a plurality of table structures includes replacing existing table structures.

22. The machine-readable medium of claim 17, wherein the instructions further cause the PLM system to receive additional table information for the table that includes at least one of a name, a description, a unique identifier corresponding to the PLM object, size units, a size, a resolution, row descriptors, data type, and column descriptors.

23. The machine-readable medium of claim 17, wherein the instructions further cause the PLM system to receive entries for one or more cells of the tables structures.

24. The machine-readable medium of claim 17, wherein the instructions further cause the PLM system to receive entries for one or more cells of the tables structures and verify that the entries are consistent with the common table definition.

* * * * *